(12) United States Patent
Takada et al.

(10) Patent No.: US 8,773,156 B2
(45) Date of Patent: Jul. 8, 2014

(54) MEASUREMENT OF INSULATION RESISTANCE OF CONFIGURABLE PHOTOVOLTAIC PANELS IN A PHOTOVOLTAIC ARRAY

(75) Inventors: Shinichi Takada, Fremont, CA (US);
Toru Takehara, Hayward, CA (US)

(73) Assignee: Applied Core Technologies, Inc., Hayward, CA (US)

( * ) Notice: Subject to any disclaimer, the term of this patent is extended or adjusted under 35 U.S.C. 154(b) by 3 days.

(21) Appl. No.: 13/412,480

(22) Filed: Mar. 5, 2012

(65) Prior Publication Data

US 2012/0223734 A1     Sep. 6, 2012

Related U.S. Application Data

(60) Provisional application No. 61/449,480, filed on Mar. 4, 2011.

(51) Int. Cl.
*G01R 31/26*         (2006.01)

(52) U.S. Cl.
USPC ...... 324/761.01; 324/551; 324/126; 324/691; 323/906

(58) Field of Classification Search
USPC .............. 324/761.01, 126, 691, 551; 323/906
See application file for complete search history.

(56) References Cited

U.S. PATENT DOCUMENTS

| | | | |
|---|---|---|---|
| 5,712,572 A * | 1/1998 | Tamechika et al. | 324/551 |
| 6,583,522 B1 * | 6/2003 | McNulty et al. | 307/71 |
| 6,753,692 B2 * | 6/2004 | Toyomura et al. | 324/718 |
| 6,812,396 B2 * | 11/2004 | Makita et al. | 136/244 |
| 6,888,357 B2 * | 5/2005 | Blasing et al. | 324/538 |
| 2007/0285102 A1 * | 12/2007 | Muller | 324/525 |
| 2010/0085670 A1 | 4/2010 | Palaniswami et al. | |
| 2011/0031813 A1 * | 2/2011 | Falk | 307/77 |
| 2011/0204900 A1 * | 8/2011 | Beck | 324/537 |
| 2011/0273163 A1 * | 11/2011 | Jungerman et al. | 324/126 |
| 2012/0014020 A1 * | 1/2012 | Lehmann | 361/42 |
| 2012/0043988 A1 * | 2/2012 | Ramsey et al. | 324/761.01 |
| 2012/0049855 A1 * | 3/2012 | Crites | 324/537 |
| 2012/0119755 A1 * | 5/2012 | Ishii et al. | 324/551 |
| 2012/0182024 A1 * | 7/2012 | Ike et al. | 324/509 |
| 2013/0082724 A1 * | 4/2013 | Noda et al. | 324/750.01 |
| 2013/0300430 A1 * | 11/2013 | Lindsay et al. | 324/522 |

FOREIGN PATENT DOCUMENTS

| | | |
|---|---|---|
| JP | 2010-068558 A | 3/2010 |
| JP | 2011-002417 A | 1/2011 |
| KR | 10-2010-0043413 A | 4/2010 |

* cited by examiner

*Primary Examiner* — Huy Q Phan
*Assistant Examiner* — Adam Clarke
(74) *Attorney, Agent, or Firm* — GSS Law Group

(57) ABSTRACT

Methods for measuring insulation resistance in a photovoltaic (PV) array may include partitioning the PV array into groups of PV panels, isolating a group of PV panels selected for an insulation resistance measurement from other groups of panels by setting bypass selectors on each PV panel in the PV array, and making an insulation resistance measurement for the selected group. If a measured value of insulation resistance for a selected group corresponds to an insulation problem in a PV array component, a separate measurement of insulation resistance may be made for each PV panel in the selected group. Insulation resistance measurements may be made accurately and rapidly for large PV arrays without disconnecting and reconnecting cables between panels. Measurements may be made at frequent, regular intervals to permit changes in insulation resistance to be detected before damage from dielectric breakdown occurs.

16 Claims, 12 Drawing Sheets

MEASUREMENT OF INSULATION RESISTANCE OF CONFIGURABLE PHOTOVOLTAIC PANELS IN A PHOTOVOLTAIC ARRAY

CROSS REFERENCE TO RELATED APPLICATIONS

This application claims the benefit of U.S. Provisional Application No. 61/449,480, filed Mar. 4, 2011, incorporated herein by reference in its entirety.

FIELD OF THE INVENTION

Methods for measuring and monitoring insulation resistance in an operating photovoltaic (PV) panel, and more specifically to methods suitable for measuring insulation resistance of PV panels adapted for reconfigurable serial and parallel electrical connections in a configurable PV array.

BACKGROUND

A photovoltaic cell is a solid state device fabricated from a thin slice of semiconductor material that outputs a relatively low voltage and small amount of current when exposed to light. Many PV cells may be electrically connected together to form a PV module. The current and voltage output from the PV module result from the combined output of the PV cells in the PV module. The PV module protects the PV cells from moisture, contaminants, and damage from flexure and impact, and includes an electrical connector or electrical terminals for electrically connecting one PV module to another or for connecting the PV module to an inverter or other electrical load. PV modules are available with output power of a few tens of watts to a few hundred watts. One or more PV modules may be attached to a support frame and combined with electrical connectors, interconnect cables, and optional components such as temperature sensors and voltage sensors to form a mechanical and electrical assembly referred to as a PV panel. All of the PV modules on one PV panel may be positioned to face in one direction as a group. The PV panel may optionally be placed on a tracking system to follow the sun's diurnal motion. Instead of moving the PV panel, a movable mirror may be directed to reflect sunlight onto all the PV modules on the PV panel. PV panels may be further combined together into an electrical circuit referred to as a PV array for generating larger amounts of electrical power. PV arrays are available with output capacity of a few kilowatts of electric power for residential or small business use, up to hundreds of megawatts for utility-scale generation of electricity.

PV modules include electrical insulation to constrain the flow of electrical energy from PV cells to specified conductive pathways within the modules and to electrically isolate the PV modules from electrically conductive structural elements such as metallic support frames and other external structures. Electrical insulation is also provided on electrical conductors and connectors between PV modules in a PV panel and between PV panels in a PV array for blocking leakage currents to support structures, to the earth (electrical ground reference), to prevent human exposure to hazardous voltages and currents, and to reduce the risk of fire. Materials used for electrical insulation are subject to aging effects, mechanical damage, and damage from exposure to corrosive chemical compounds, any of which may lead to dielectric breakdown of the insulating material and allow potentially damaging or dangerous leakage currents to flow.

Electrical resistance measurements may be made on PV panels to determine the integrity of electrical insulation in the panels and in connections between panels in a PV array. A decrease in the electrical resistance of electrical insulation in a single PV panel can lead to leakage currents which decrease the power output of an entire PV array. Once a leakage current starts to flow, dielectric breakdown can accelerate, so it is important to detect leakage currents quickly so that PV panels with degraded or defective electrical insulation can be isolated from the PV array and repaired.

An insulation resistance tester (IRT) is a measuring instrument which may be used for detecting dielectric breakdown of electrically insulating materials. Some insulation resistance testers, for example the MEGGER™ line of test instruments produced by Megger, Ltd., operate by subjecting components in an electrical circuit to a known, relatively high voltage, and making measurements related to insulation resistance or leakage current. Insulation resistance test procedures may include warnings to test personnel to make sure that the circuit being tested is not energized by power sources other than the test instrument itself, and may warn personnel to avoid hazardous voltages produced during insulation resistance tests. In addition to current and voltage hazards, PV panels may be placed on building roofs or other locations that are difficult or dangerous for test personnel to access for the purpose of conducting insulation resistance tests. Testing insulation resistance of PV panels in a PV array using conventional methods can therefore be a lengthy, labor-intensive activity because each panel or group of panels being tested must be de-energized and electrically isolated, for example by removing electrical cables or wires between the PV panel being tested and the rest of the PV array before testing can be conducted safely and accurately. Any wires or cables removed before testing must then be reinstalled after tests are complete. Alternately, a PV panel to be tested may be mechanically and electrically disconnected from a PV array. Whichever of these methods is used for electrically isolating a PV panel to be tested, some disassembly and reassembly of PV array components may be required, thereby risking personnel exposure to the hazards of an installed and possibly energized PV array. There is also a risk of damage to the PV array components during disassembly and reassembly.

Completing a set of insulation resistance measurements can take an entire PV array off line for the duration of the test. The larger the PV array, the greater the difficulty in identifying and correcting an electrical insulation problem and the greater the economic loss associated with the value of power that would otherwise have been generated during insulation resistance testing. The difficulty and expense in conducting insulation resistance tests by conventional methods creates economic and safety disincentives for regular monitoring of insulation resistance throughout a PV array. If insulation resistance is not monitored sufficiently often, problems with electrical insulation may not be found before a destructive fault occurs.

It would be preferable to conduct insulation resistance tests on every PV panel and associated interconnect cables in a PV array without mechanically removing PV panels or interconnect cables from the PV array and without exposing test personnel to hazardous voltages and currents, either from current and voltage generated by the PV array or from current and voltage injected into the PV array by an insulation resistance tester. It would further be preferable to monitor changes in insulation resistance everywhere in large PV arrays comprising many hundreds or many thousands of PV panels, and to detect dielectric breakdown in electrically insulating materials before the power output of the entire array is affected and before PV array components are damaged.

SUMMARY

Methods for measuring insulation resistance in a photovoltaic (PV) array include the steps of selecting a group of PV panels in the PV array for a measurement of insulation resistance, setting a bypass selector for each PV panel in the selected group to a non-bypassed switch state, setting a bypass selector for each PV panel not included in the selected group to a bypassed switch state; and measuring a value of insulation resistance for the selected group of PV panels.

Methods for measuring insulation resistance values for cable assemblies and feeders in a PV array include the steps of setting a series-parallel selector on each PV panel in the PV array to connect all the PV panels to one another with serial electrical connections, setting a bypass selector on each PV panel in the PV array to a "bypass" switching state, thereby excluding output voltage from a PV module on each PV panel from PV array output voltage, and measuring a value of insulation resistance for the PV array.

Methods for optimizing PV array output power include the steps of measuring an insulation resistance value for a PV panel in a PV array, comparing the measured value of insulation resistance for the PV panel to a threshold value corresponding to a selected value of leakage current, and when the measured value of insulation resistance is less than the threshold value, setting a bypass selector on the PV panel to a bypass switching state.

This section summarizes some features of the present invention. These and other features, aspects, and advantages of the invention will become better understood with regard to the following description and upon reference to the following drawings.

DESCRIPTION

Figure 1:
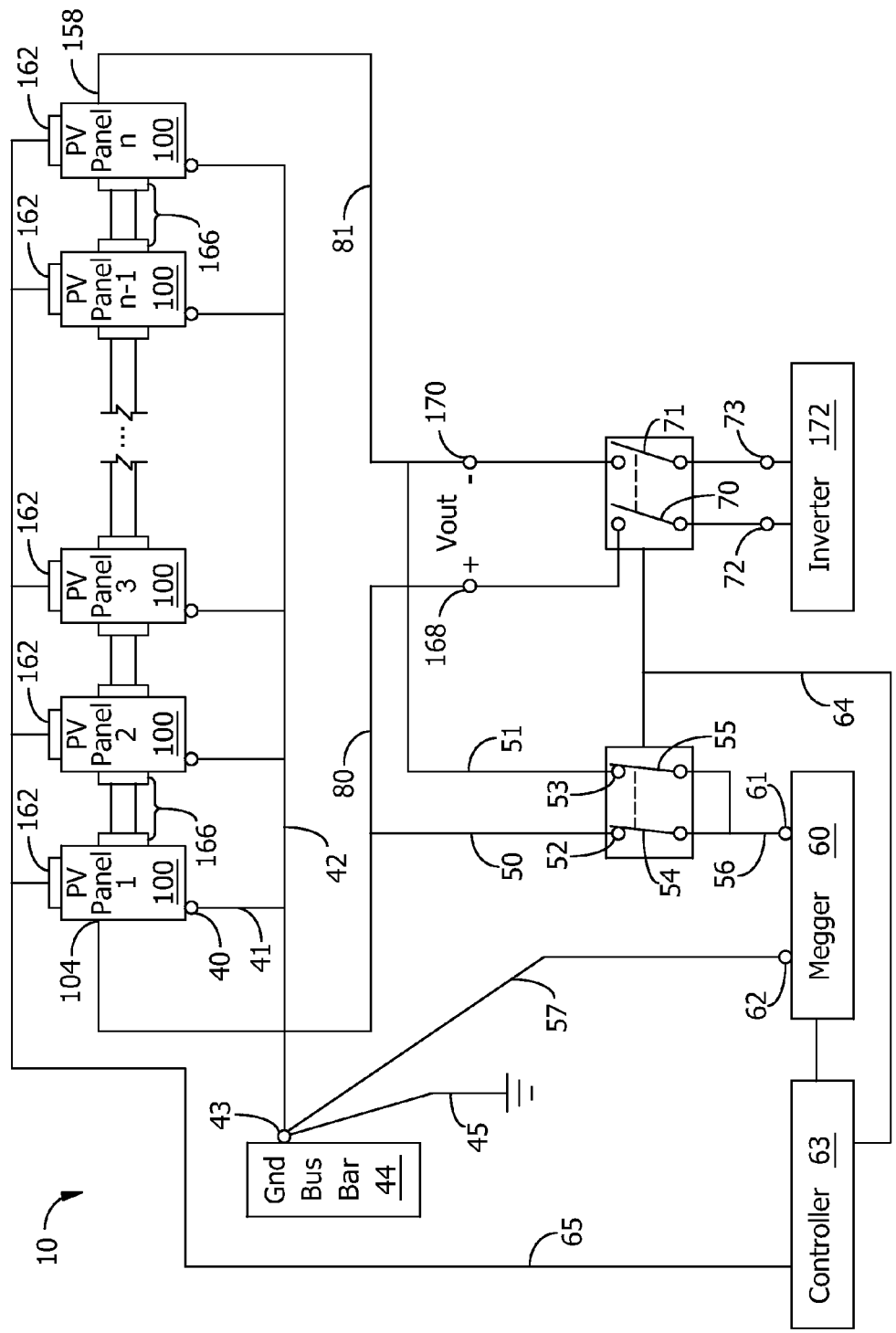
FIG. 1 is a schematic diagram of an example of a configurable PV array operable in accord with embodiments of the invention.

Embodiments of the invention comprise steps in a method for measuring insulation resistance of configurable PV panels in a configurable PV array. Embodiments of the invention include steps for configuring bypass selectors, serial-parallel selectors, and optionally other switching devices on configurable PV panels in a configurable PV array to selectively isolate one PV panel, or alternately one group of PV panels, from other PV panels in the PV array so that an insulation resistance measurement of the selected panel or selected group of panels can be performed quickly, safely, and accurately. After the insulation resistance measurement for one configurable PV panel or group of panels is completed, the PV panel or group of panels may be reconnected to the PV array by suitable settings for a bypass selector, and another PV panel or group of panels may be selected for another insulation resistance test, until an insulation resistance measurement has been made for every PV panel or group of panels in a PV array. If a problem is found within a group of panels, the individual configurable PV panels within the group can be tested quickly to localize the problem. Insulation resistance tests may be performed under the direction of a supervisory monitoring and control system for a PV array or may be initiated and conducted autonomously by configurable PV panels in a configurable PV array.

Embodiments of the invention may be advantageous for rapidly locating insulation resistance faults on specific PV panels in a PV array, even for utility-scale PV arrays comprising thousands or hundreds of thousands of PV panels. Insulation resistance measurements may be made without removing any PV panels from the PV array or detaching and reattaching any interconnect cables between PV panels or between an insulation resistance test instrument and parts of the PV array being tested. Supervisory, test, and maintenance personnel may therefore be protected from exposure to hazardous voltages or currents while performing the disclosed method steps, and may conduct tests remotely from a location that may be far from the location of the PV panels in a PV array. Other advantages of the embodiments of the invention disclosed herein may include enabling preventive maintenance of PV array components before damage occurs, rapid detection and isolation of PV panels and associated interconnect cables with insulation resistance failures, optimizing PV array output by isolating PV panels with insulation resistance problems from other PV panels, and completing insulation resistance tests on PV panels in a PV array over a relatively short time interval in which the PV array would not normally be generating power, for example at night when the array is not operating.

Embodiments of the invention are directed at making insulation resistance measurements of configurable PV panels in a configurable PV array. A configurable PV panel enables an output voltage from a PV array to be increased in response to a decrease in an amount of illumination incident on the PV array. Configurable PV panels are beneficial for controlling electric power output from a PV array and for recovering an amount of photovoltaically generated electric power that would be wasted in a PV array comprising PV panels known in the art. Configurable PV panels are further beneficial for maximizing an amount of power from a PV array in which some of the PV panels in the PV array are electrically disconnected from the PV array for reasons of maintenance, for example to clean a PV panel or to repair a damaged or malfunctioning PV panel.

A configurable PV panel adapted for use with an embodiment of the invention includes at least one, and optionally more than one, PV module, a bypass selector for selectively including or excluding current and voltage from the one or more PV modules from electrical input and output connections on the PV panel, a serial-parallel selector for selectively making serial or parallel circuit connections between two or more configurable PV panels, and a node controller for operating the bypass and serial-parallel selectors and for monitoring the status of the PV panel. The node controller on a PV panel may include an input/output bus for bidirectional communication of data and commands with other configurable PV panels and optionally with an external control and monitoring system.

A configurable PV array includes at least two configurable PV panels interconnected by cable assemblies. Embodiments of the method disclosed herein are suitable for use with a wide variety of PV arrays, including PV arrays having a number of PV panels suitable for residential applications and PV arrays having a number of PV panels suitable for utility-scale electric power generation. The larger the number of configurable PV panels included in a configurable PV array, the greater the advantage offered by the methods disclosed herein compared to methods known in the art, such as methods requiring disconnection of electrical cables between PV panels or removal of a PV panel from a PV panel array prior to performance of insulation resistance tests. Furthermore, because interconnect cables or test leads between insulation resistance test equipment and a PV array being tested are typically not repositioned during tests in accord with the method disclosed herein, the test equipment configuration remains stable and historical test records may be compared accurately with current test results to detect and predict trends in insulation resistance measurements, thereby possibly enabling preventive action before insulation dielectric breakdown can cause damage to PV array components.

FIG. 1 illustrates an example configurable PV array 10 adapted for insulation resistance tests in accord with embodiments of the invention. The example configurable PV array comprises a plurality of configurable PV panels 100 connected by cable assemblies 166. The configurable PV panels 100 may be connected in series electrical circuits, parallel electrical circuits, or combinations of series and electrical connections, and each configurable PV panel 100 may be isolated from serial or parallel combination with other PV panels, as will be explained below. Unless otherwise stated, two components are considered to be "connected" herein when the components are electrically connected and current may flow from one component to the other. Each configurable PV Panel 100 includes a control and monitoring interface 162 for sending and receiving data and commands to other PV panels 100 and to a controller 63 over a communication network 65. The communication network 65 may be implemented as a wired network or a wireless network.

In the example embodiment of FIG. 1, voltage and current output from the PV panels 100 is connected from a terminal 104 on PV panel 100 number 1 by a PV array positive output feeder 80 to a PV array positive output terminal 168 and from a terminal 158 on PV panel 100 number n by a PV array negative output feeder 81 to a PV array negative output terminal 170. A voltage Vout measured from the PV array negative output terminal 170 to the PV array positive output terminal 168 represents the output voltage from the PV array. Each PV panel 100 includes an earth terminal 40 connected to an earth terminal line 41. Earth terminal lines 41 are connected to a common ground line 42 connected at a terminal 43 on a ground bus bar 44. The ground bus bar 43 is further connected to an earth ground line 45 which provides an earth ground voltage reference for the rest of the system.

In the illustrated embodiment, the PV array positive output terminal 168 is connected through a positive output switch 70 to a positive direct current (DC) input terminal 72 on an inverter 172. The PV array negative output terminal 170 connects through a negative output switch 71 to a negative DC input terminal 73 on the inverter 172. The PV array positive output feeder 80 connected to positive output terminal 168 is further connected by a PV array positive output branch line 50 to a positive output branch terminal 52, and is also connected through a first shorting switch 54 to a short circuit line 56 leading to an IRT line terminal 61, an input of the example of an insulation resistance test (IRT) instrument labeled IRT 60. The PV array negative output feeder 81 connected to negative output terminal 170 is further connected by a PV array negative output branch line 51 to a negative output branch terminal 53, and is also connected through a second shorting switch 55 to IRT line terminal 61. An earth terminal 62 on IRT 60 is connected by an IRT ground line 57 to the terminal 43 on the ground bus bar 44.

In this embodiment, the IRT 60 is connected by the communication network 65 to the controller 63, and optionally to the node controllers in each configurable PV panel 100 for the exchange of commands and measurement data related to conducting insulation resistance tests on parts of the configurable PV array 10. Switch control line 64 enables the controller 63 to open and close the first shorting switch 54, second shorting switch 55, positive output switch 70, and negative output switch 71. The controller 63 in FIG. 1 is representative of a local computer control system for operating the IRT 60 and for receiving measurement data from the IRT 60. Controller 63 may optionally communicate over the network 65 with an external supervisory control and monitoring system (not illustrated). The controller 63 optionally controls settings for bypass selectors in the PV panels 100. Bypass selectors may alternatively be operated autonomously by node controllers on each PV panel 100 or by commands sent to each PV panel 100 by the external supervisory control and monitoring system.

Insulation resistance measurements in accord with the methods disclosed herein may alternately be made on individual PV panels isolated from other parts of a PV array by operation of bypass selectors, or on selected groups of PV panels, wherein bypass selectors on the PV panels in a selected group are set to isolate the group members from some other parts of the PV array. A method embodiment of the invention may optionally begin with the step of partitioning a PV array into groups of PV panels, then measuring the insulation resistance of each group. If no dielectric breakdown or other insulation resistance problems are detected in a selected group of PV panels, measurements may be conducted on another group. Measurements may be made group by group until all groups are measured. If a dielectric breakdown fault or degraded insulation is detected in a group, panels may be tested one by one within the group until a faulty panel or interconnect cable is identified. Testing a group at a time minimizes an amount of time required to detect insulation resistance faults and determine a location for a fault in a large PV array. Alternatively, insulation resistance values for individual PV panels may be measured sequentially until every PV panel in a PV array has been tested.

Historical insulation resistance data may be maintained for groups of PV panels and for individual panels to permit comparison of current measurement results to previous measurement results by the controller 63 or by an external supervisory and monitoring system. Historical records created by saving previous insulation resistance values and current measurements may optionally be compared to identify trends in insulation resistance values. Trends in insulation resistance values may be used to predict a failure time for a particular panel or group of panels by calculating a rate of change in an insulation resistance value and projecting a time when the insulation resistance value will fall below a specified threshold value of insulation resistance, for example a threshold value corresponding to an unacceptably high risk of the occurrence of a dielectric breakdown fault. A method for performing preventive maintenance to avoid dielectric breakdown failures may therefore include the steps of saving previously measured values of insulation resistance for a selected PV array component in a historical record, calculating a rate of change in the insulation resistance value for the selected PV array component by comparing measurements from historical records with current measurements, projecting a time duration for the insulation resistance value to fall below a specified threshold value of insulation resistance, at the calculated rate of change, and performing preventive maintenance on the selected PV array component before the expiration of the projected time duration.

Figure 2:
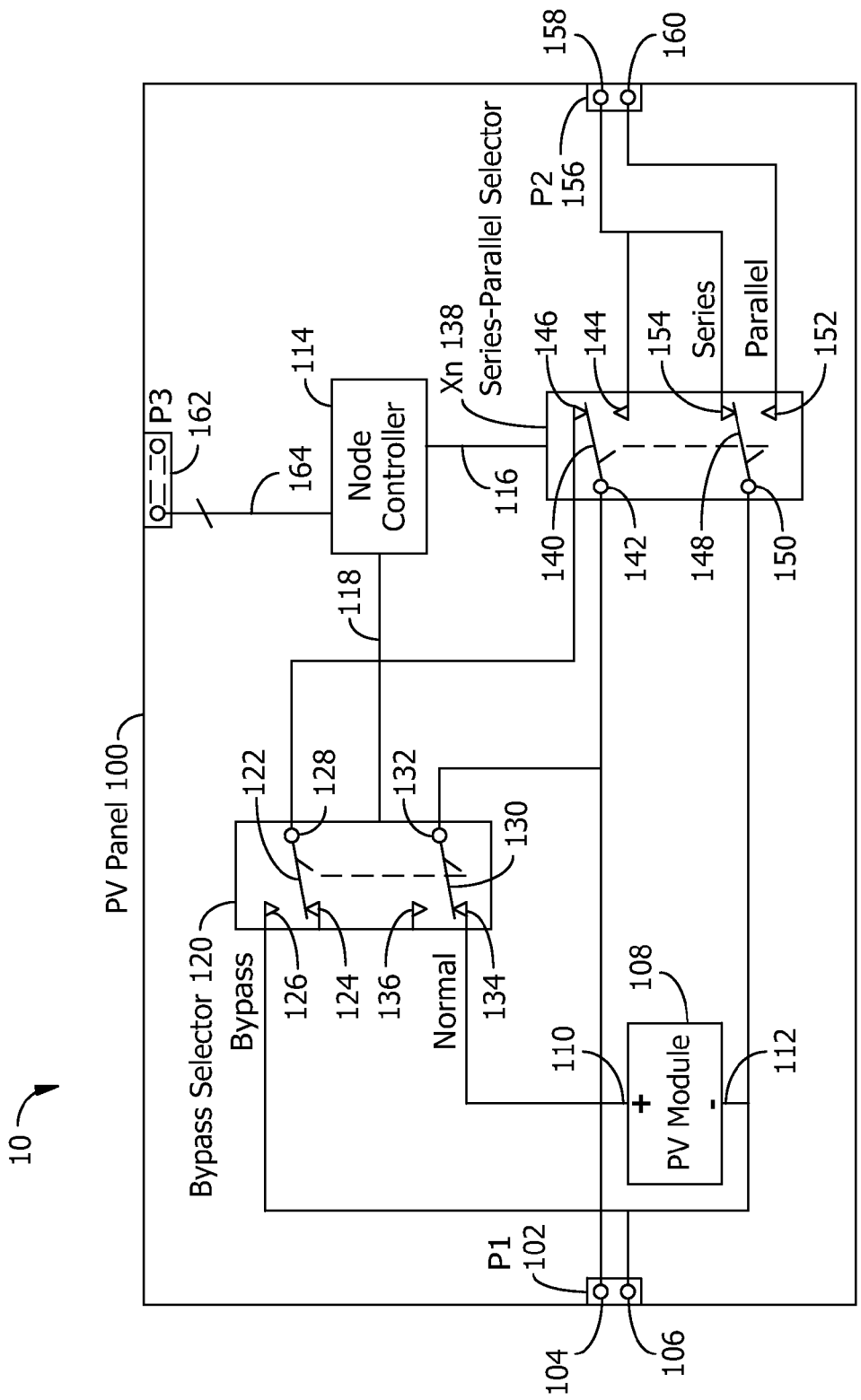
FIG. 2 is a schematic diagram of an example of a configurable PV panel for a configurable PV array.
Figure 12:
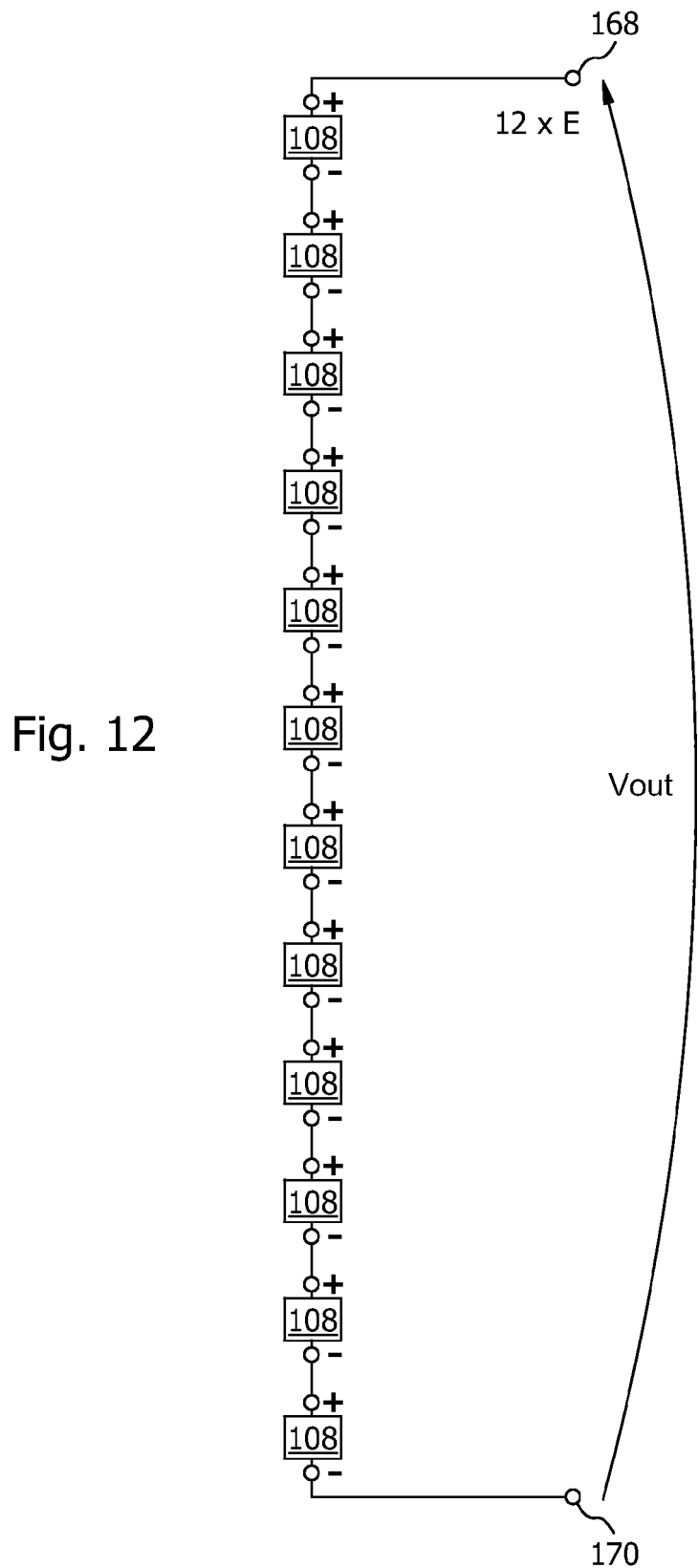
FIG. 12 shows an example of an equivalent electrical circuit for an alternative electrical configuration for the PV array of FIG. 6. In the example of FIG. 12, all of the configurable PV panels in the PV array are interconnected in a series electrical circuit having a PV array output voltage of 12E volts.
Figure 13:
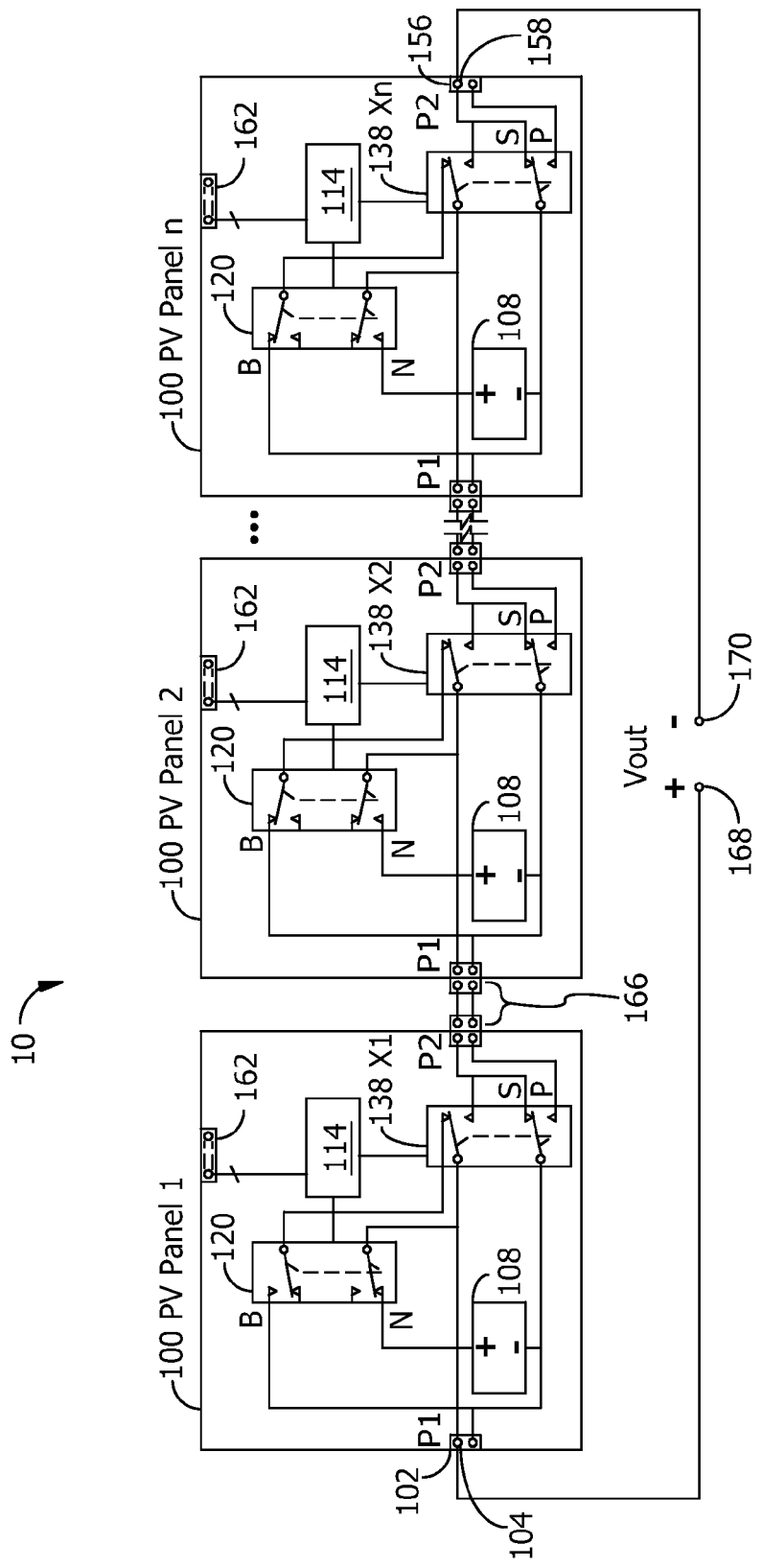
FIG. 13 is a schematic diagram of an example of an alternative electrical configuration for the PV array of FIGS. 3-5 in which the electrical power output of PV panels 2 to n have been excluded from the PV array output voltage Vout by setting a bypass selector in each bypassed PV panel to a "B" switching state.
Figure 14:
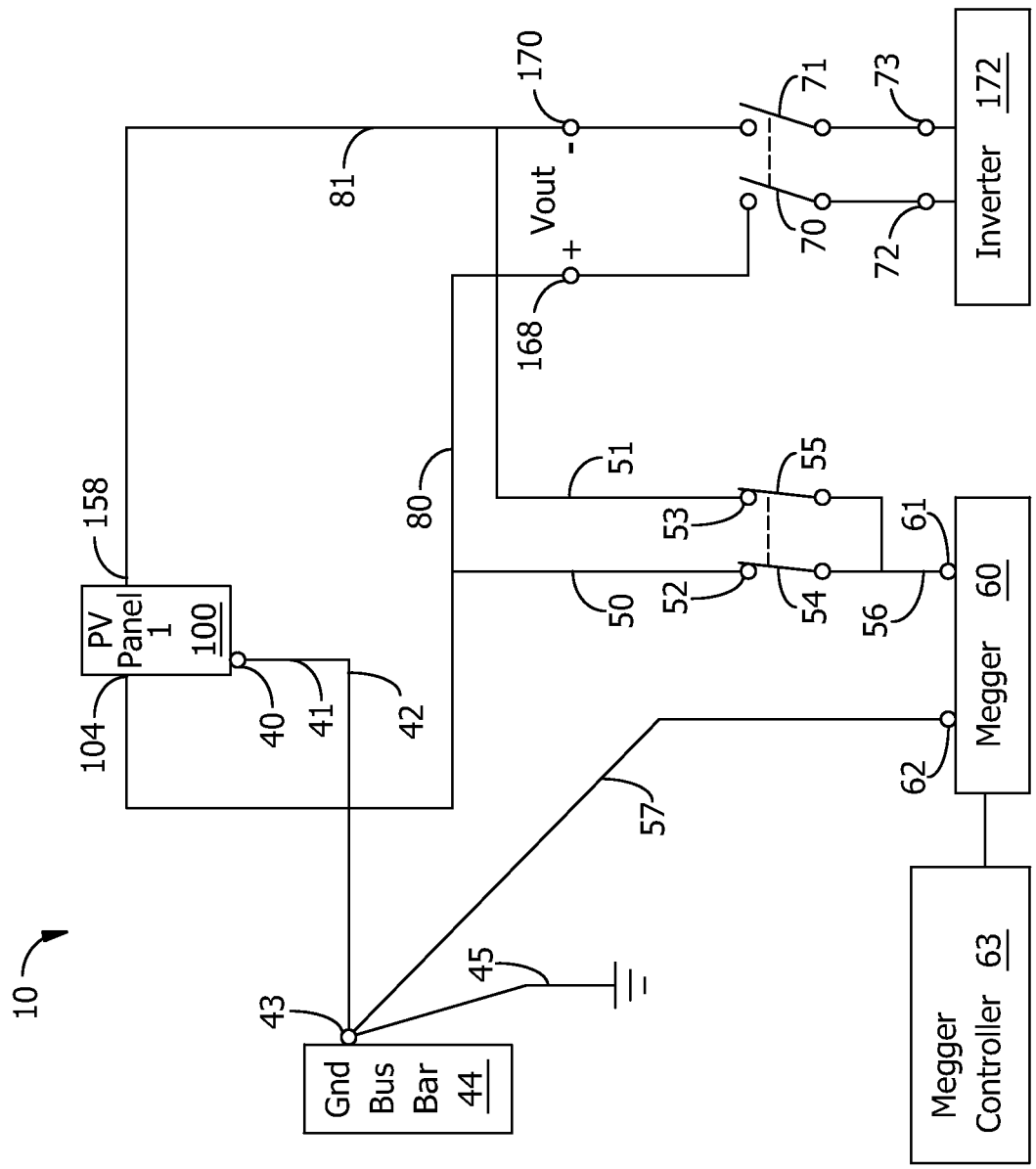
FIG. 14 is a simplified schematic diagram showing an example of electrical connections between an IRT and one PV panel representing a PV panel selected for insulation resistance testing from the PV array of FIG. 1 by suitable selection of bypass selectors on each PV panel in the PV array.

FIG. 2 shows an example of a PV panel 100 having a bypass selector 120 for selectively including or isolating current and voltage from a PV module 108 from terminals 104 and 106 on a first power connector P1 102 and terminals 158 and 160 on second power connector P2 156. The PV panel 100 may be placed in series electrical connection or parallel electrical connection to other PV panels by operation of a series-parallel selector 138. The bypass selector 120 and Series-Parallel selector 138 are controlled by the node controller 114, either autonomously or in response to signals received over connector P3 162 and bidirectional I/O bus 164 to the node controller. FIGS. 3-13 give examples of how configurable PV panels in a configurable PV array may be connected in different combinations of serial and parallel connections. FIGS. 13 and 14 may be used to illustrate how one PV panel, or a group of PV panels, may be isolated from the rest of a PV array to make insulation resistance measurements, to clean the panels, or to perform other maintenance activities on the panels, without disconnecting and reconnecting electrical cables between PV panels and without removing PV panels from the PV array.

In the example embodiment, the node controller 114 in FIG. 2 may monitor parameters related to the performance of the PV module 108 and the PV panel 100 and may set a switching state of the bypass selector 120 and a separate switching state of the series-parallel selector Xn 138. Examples of parameters monitored by the node controller include, but are not limited to, output current and output voltage from the PV module 108, temperatures measured at different selected positions on the PV module 108, azimuth and elevation angles of the PV panel 100, current and voltage input to the PV panel on the second power connector P2 156, and current and voltage output from the PV panel 100 on first power connector P1 102. The node controller 114 may optionally be configured to detect electrical fault conditions within the PV module 108 or the PV panel 100, partial shading of the PV module 108, reductions in electrical power from precipitation, dust, or debris on a surface of the PV module 108, and reductions in incident radiation from dust, precipitation, or cloud cover. Data related to monitored parameters is optionally output from the node controller 114 on a monitor and control connector P3 162 electrically connected to the node controller 114 by a plurality of electrical conductors comprising a control and monitoring signal input/output bus 164. Output data on connector P3 162 may optionally be received by other configurable PV panels 100 in a PV array or by an external monitoring and control system.

In this embodiment, switching states for the electrically controlled bypass selector 120 and the electrically controlled series-parallel selector Xn 138 determine how current and voltage output from the PV module 108 are combined with electrical power flowing through the first and second power connectors P1 102 and P2 156. As shown in the example of FIG. 2, the bypass selector 120 and the series-parallel selector Xn 138 may be double-pole, double-throw (DPDT) electromechanical relays. Any or all of the selectors (120, 138), output switches (70, 71), and shorting switches (54, 55) may alternatively be replaced by other switching devices, for example but not limited to, a solid state relay or solid state switching devices made from discrete electronic components. Either selector (120, 138) may optionally be changed from a single DPDT electrically controlled switching device to a pair of single-pole, single-throw switching devices sharing a common control line electrically connected to the node controller 114.

Referring again to the example embodiment of FIG. 2, electric power from other PV panels in a PV array may optionally be connected to the PV panel 100 on the second power connector P2 156 comprising a first terminal 158 and a second terminal 160. Voltage and current on the P2 first terminal 158 and the P2 second terminal 160 may selectively be combined with voltage and current output from the PV module 108 according to selected switching states for the bypass selector 120 and the series-parallel selector Xn 138 as will be explained later. The P2 first terminal 158 is electrically connected to a parallel terminal 144 of a first S-P switch 140 in the series-parallel selector Xn 138. The P2 first terminal 158 is further electrically connected to a series terminal 154 of a second S-P switch 148 in the series-parallel selector Xn 138. The P2 second terminal 160 is electrically connected to a parallel terminal 152 of the second S-P switch 148.

In the example embodiment, series terminal 146 of the first S-P switch 140 is electrically connected to a common terminal 128 for a first bypass switch 122 in the bypass selector 120. A common terminal 142 of the first S-P switch 140 is electrically connected to a common terminal 132 for a second bypass switch 130 in the bypass selector 120. The common terminal 142 of the first S-P switch 140 is further connected electrically to a connector P1 first terminal 104. A common terminal 150 of the second S-P switch 148 is electrically connected to a negative terminal 112 on the PV module 108, to a connector P1 second terminal 106, and to a bypass terminal 126 of the first bypass switch 122 in the bypass selector 120.

Continuing with the example of FIG. 2, a positive terminal 110 of the PV module 108 is connected electrically to a normal terminal 134 of the second bypass switch 130 in the bypass selector 120. A bypass selector control line 118 carries control signals from the node controller 114 to a control input of the bypass selector 120. A first control signal from the node controller 114 on the bypass selector control line 118 sets the bypass selector 120 to a "Bypass" switching state in which power output from the PV module 108 is excluded from being combined with power output from other PV panels in a PV array, for example electric power from other PV panels related to the voltage and current on the terminals of the first power connector P1 102. A "Bypass" switching state is also referred to herein as a "B" switching state. A second control signal from the node controller 114 on the bypass selector control line 118 sets the bypass selector 120 to a "Normal" switching state, also referred to as a non-bypassed switching state, in which output from the PV module 108 is combined with electric power input to the PV panel 100, for example power corresponding to the voltage and current on the terminals of the connector P1 102 according to one of two alternate switching states for the series-parallel selector Xn 138. A "Normal" switching state is also referred to herein as an "N" switching state. In the example of FIG. 2, the first bypass switch 122 and the second bypass switch 130 in the bypass selector 120 are shown in the "Normal" switching state. FIG. 2 further shows the first bypass switch 122 normal terminal 124 and the second bypass switch 130 bypass terminal 136 as unterminated. Passive components may optionally be electrically connected to the unterminated terminals to reduce an amount of noise coupled into the circuit.

In the example embodiment, series-parallel selector control line 116 carries control signals from the node controller 114 to a control input of the series-parallel selector Xn 138. A third control signal from the node controller 114 on the series-parallel selector control line 116 sets the series-parallel selector Xn 138 to a "Series" switching state, also referred to herein as an "S" switching state. A fourth control signal from the node controller 114 on the series-parallel selector control line 116 sets the series-parallel selector Xn 138 to a "Parallel" switching state, also referred to herein as a "P" switching state. In the example of FIG. 2, the first S-P switch 140 and the second S-P switch 148 in the series-parallel selector Xn 138 are shown in the "Series" switching state.

Figure 3:
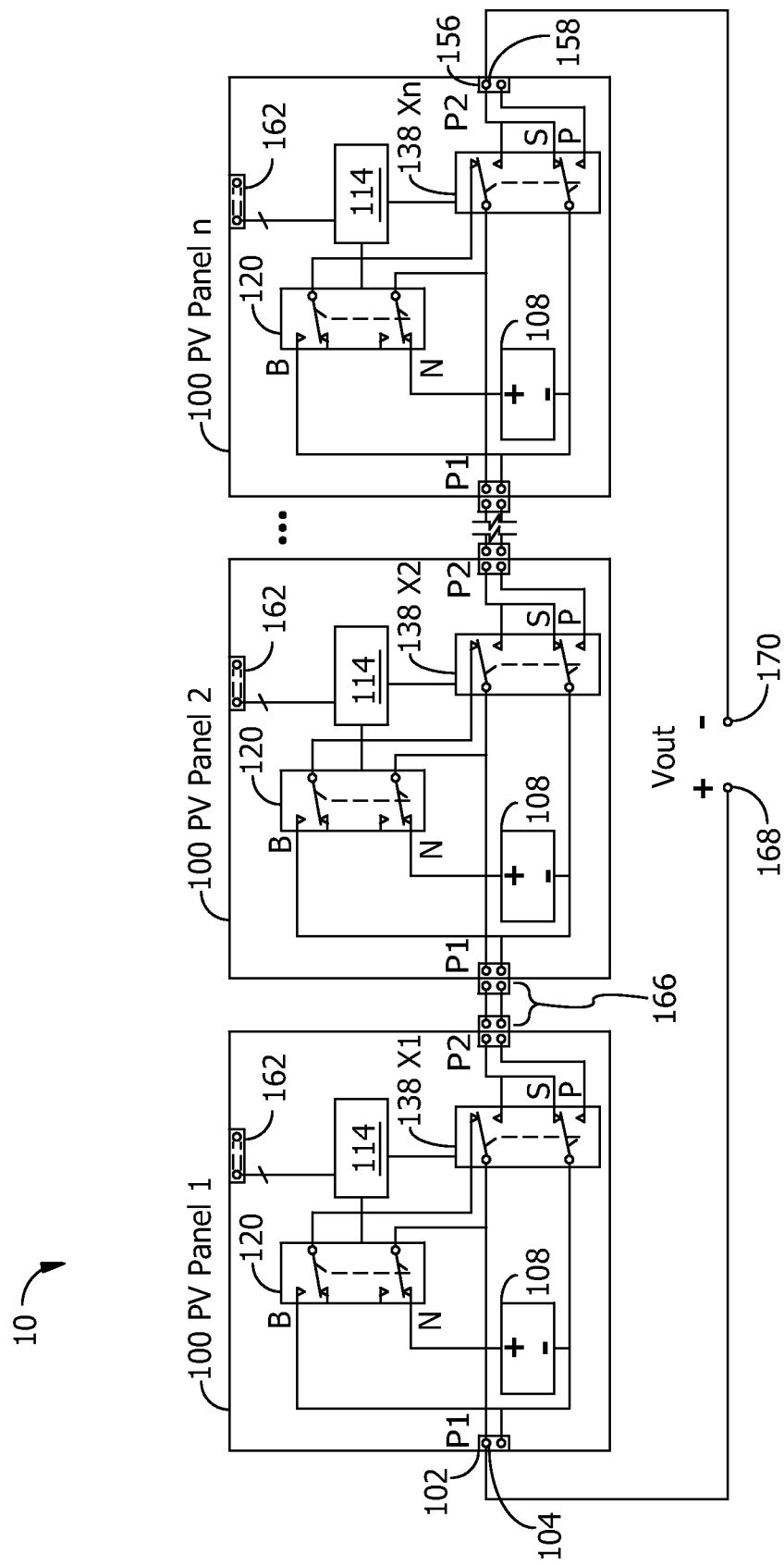
FIG. 3 is a schematic diagram of an example of a PV array having an integer number "n" of the configurable PV panels of FIG. 2 interconnected into a series electrical circuit.

A photovoltaic power generating system in accord with an embodiment of the invention includes at least one configurable PV array having a plurality of configurable PV panels. A large photovoltaic power generating system, for example a photovoltaic system for an electric power utility, may optionally include more than one configurable PV array. FIG. 3 illustrates an example of a PV array 10 having an integer number "n" of configurable PV panels 100 electrically connected by cable assemblies 166 in a series electrical configuration. As shown in FIG. 3, series-parallel selectors (138 X1, 138 X2, . . . 138 Xn) are shown in an "S" switching state. All of the bypass selectors 120 in the "n" number of panels are set to an "N" switching state in the example of FIG. 3. An output voltage Vout from the PV array, measured from a PV array negative output terminal 170 to a PV array positive output terminal 168, is the sum of the output voltages of the "n" PV modules 108. In the configuration shown in FIG. 3, an output voltage for the PV array is Vout measured from a connector P2 terminal 1 158 in PV panel number "n" to a connector P1 terminal 1 104 in PV panel number 1. In the case of a PV panel having the series-parallel selector set to the "S" state and the bypass selector 120 set to the "B" state, output voltage from the PV panel's PV module is excluded from the output voltage Vout by a circuit path in the PV panel bypassing the PV module between the first power connector P1 and the second power connector P2.

Figure 4:
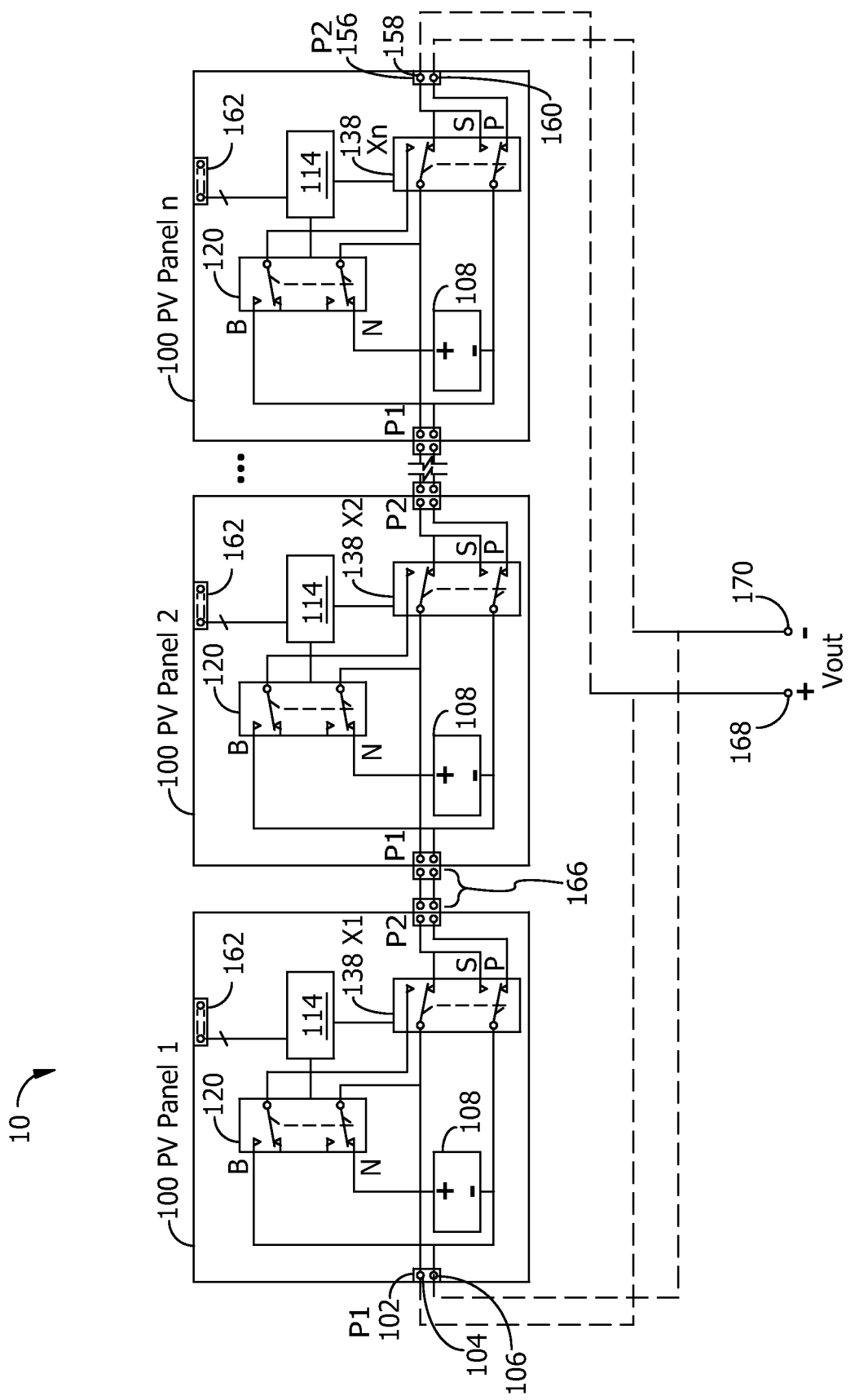
FIG. 4 is an example of an alternative electrical configuration for the PV array of FIG. 3 in which the configurable PV panels have been switched from series electrical connections to parallel electrical connections between PV panels.

FIG. 4 illustrates an example of one of many alternative electrical configurations for the "n" number of PV panels electrically connected to form a PV array in the PV array 10 of FIG. 3. In the example of FIG. 4, an integer number "n" of PV panels 100 are electrically interconnected by cable assemblies 166 in a parallel electrical configuration with series-parallel selectors (138 X1, 138 X2, . . . 138 Xn) in a "P" switching state. Bypass selectors 120 are shown in an "N" switching state. An output voltage Vout from the PV array, measured from a PV array negative output terminal 170 to a PV array positive output terminal 168, is equal to an output voltage from any one of the PV panels 100 all of which, for purposes of this example, have equal output voltages. In the case of configurable PV panels having different output voltages, a PV array output voltage may be calculated by conventional methods for analyzing parallel electrical circuits. An output current from the PV array example of FIG. 4 is equal to the arithmetic sum of the current output from each of the "n" number of panels, an optional current input to connector P1 on PV panel 100 number 1, and an optional current input to connector P2 on PV panel 100 number "n". PV array negative output terminal 170 may alternately be electrically connected to connector P2 terminal 2 160 on PV panel 100 number n or to connector P1 terminal 2 106 on PV panel 100 number 1, as indicated by dashed connection lines in FIG. 4. PV array positive output terminal 168 may alternately be electrically connected to connector P1 terminal 1 104 on panel number 1 or to connector P2 terminal 1 158 on panel number n, as indicated by dashed connection lines in FIG. 4.

The example of a parallel configuration shown in FIG. 4 has the advantage of generating the maximum amount of PV array output current for a given level of incident illumination. However, in the case where an output voltage from one or more of the PV panels in the example of FIG. 4 decreases, for example from a shadow falling across the PV modules on the PV panels or from current leakage from insulation breakdown in a PV panel or its associated interconnect cables, the output voltage of the entire PV array decreases. As incident illumination continues to decrease or current leakage increases, the PV array output voltage eventually falls below the minimum input voltage specification for an inverter, and any further power produced by the array can not be coupled to an electric power grid through the inverter, that is, the power generated by the PV array is wasted power.

Selectively connecting some PV panels in series and others in parallel may increase the output voltage from a PV array compared to a PV array with only parallel connections between PV panels. By connecting the minimum number of PV panels in series to make a PV array output voltage that is greater than the inverter minimum input voltage, current output from the array may be maximized under conditions of reduced illumination. An increasing number of PV panels may selectively be electrically connected in series in response to falling illumination levels, for example as the sun sets or as a thick cloud layer gradually blocks sunlight incident on a PV array, until all panels in the array are connected in series and the maximum possible PV array output voltage is produced.

Figure 5:
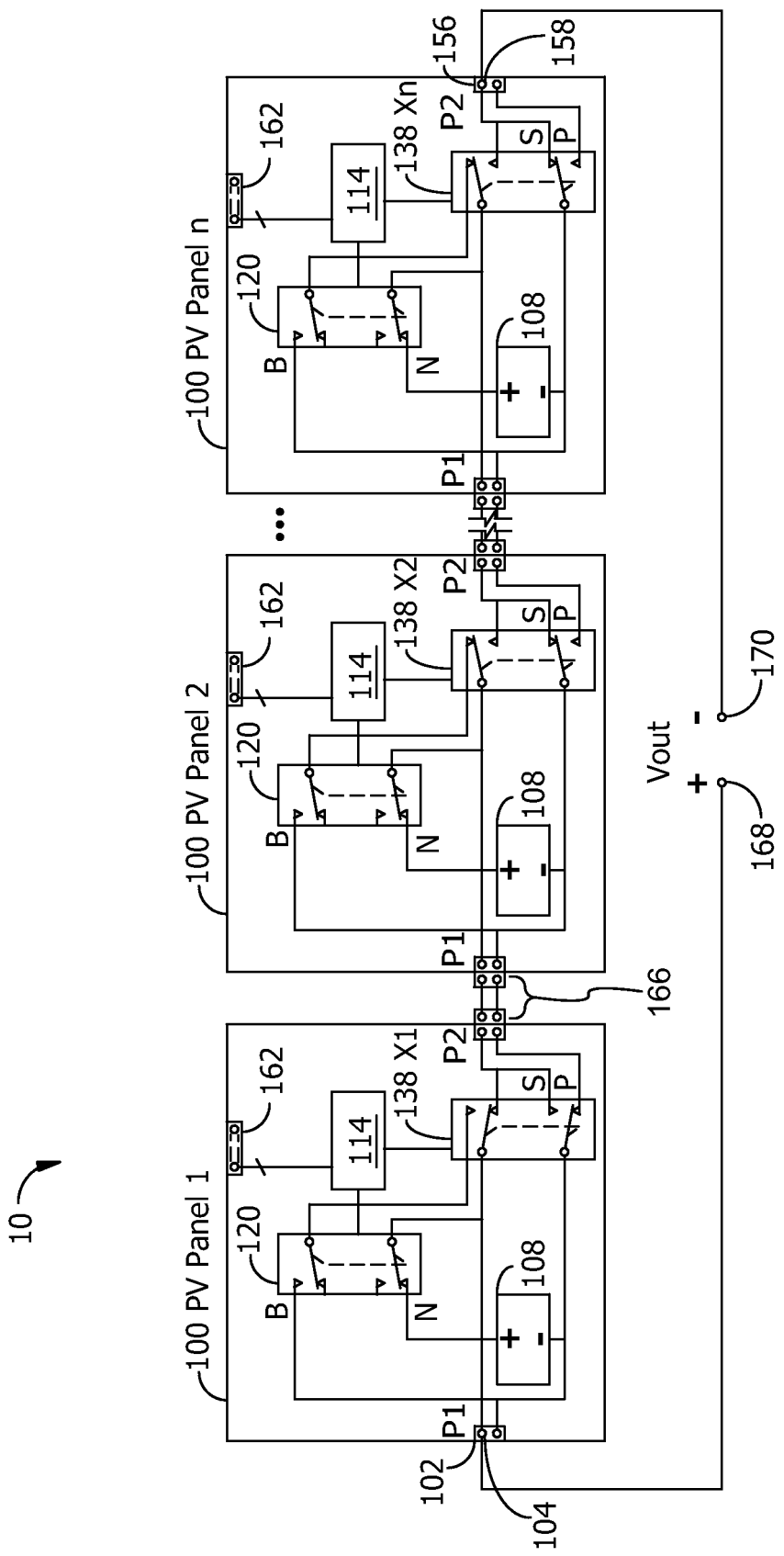
FIG. 5 is an example of an alternative electrical configuration for the PV array of FIG. 3 in which two PV panels are electrically connected in parallel to one another and are further connected in series to at least one other PV panel.

FIG. 5 shows an example of a PV array including three PV panels connected in a combination of series and parallel electrical connections. In the example of FIG. 5, PV panel 100 number 1 has a series-parallel selector 138 X1 set to a "P" switching state. The series-parallel selector 138 X2 in PV Panel 100 number 2 is in an "S" switching state, and PV panel number 3 has a series-parallel selector 138 X3 set to an "S" switching state. A PV array output voltage Vout measured between the PV array positive output terminal 168 and the PV array negative output terminal 170 in FIG. 5 is approximately twice the PV array output voltage for PV panels connected in parallel as shown in the example of FIG. 4. A PV array configured as in FIG. 5 may therefore produce an output voltage that is greater than or equal to the minimum input voltage for an inverter under lower levels of illumination than the PV array example of FIG. 4. A PV array having selectable series and parallel connections between PV panels, as in the example of FIG. 5, captures electrical power for output to an electric power grid under conditions in which PV panels interconnected only in parallel output power at too low a voltage for connection to an inverter input.

Figure 6:
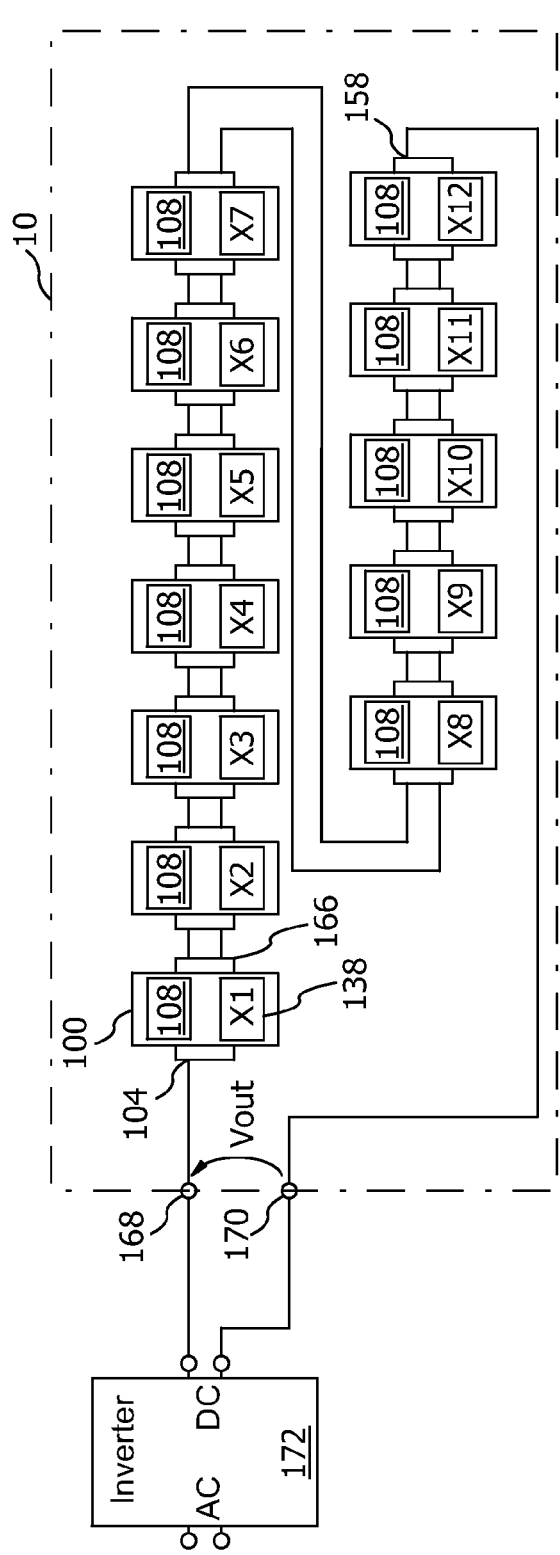
FIG. 6 shows an example of a configurable PV array comprising twelve configurable PV panels electrically interconnected by cable assemblies. Each of the configurable PV panels in FIG. 6 includes a PV module, a bypass selector (not illustrated), and an electrically controlled series-parallel selector as in FIG. 2. The PV array of FIG. 6 may be selectively configured as in any of the examples of FIG. 7-12 according to settings chosen for series-parallel selectors X1-X12, without altering cable assembly connections between PV panels.

FIG. 6 may be used to illustrate examples of combinations of series and parallel electrical connections and corresponding PV array output voltages produced by a configurable PV array having twelve configurable PV panels. The example of a configurable PV array 10 of FIG. 6 includes twelve configurable PV panels, each PV panel in accord with the examples of FIG. 2 or 15 and electrically interconnected in a PV array by cable assemblies 166. An output voltage Vout from the PV array is measured across a PV array positive output terminal 168 and a PV array negative output terminal 170. Connector P1 terminal 1 104 on PV panel 100 number 1 is electrically connected to PV array 10 positive output terminal 168, which is further electrically connected to a first DC input on an inverter 172. Connector P2 terminal 1 158 on PV panel 100 number 12 is electrically connected to PV array 10 negative output terminal 170, which is further electrically connected to a second DC input on the inverter 172. Each of the PV panels 100 represented in simplified form in FIG. 6 includes a PV module 108 and a series-parallel selector (X1, X2, X3, . . . X12).

Figure 7:
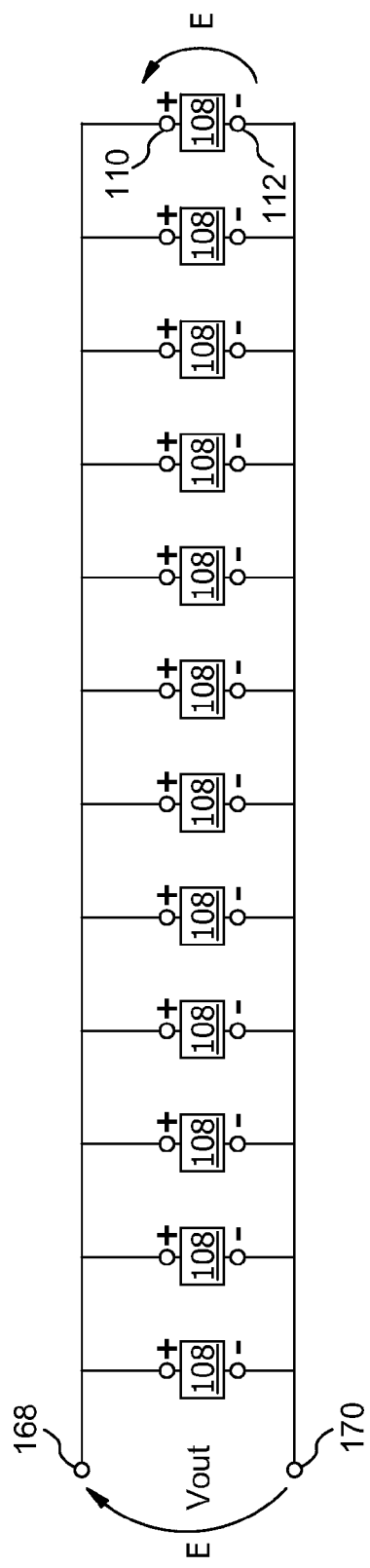
FIG. 7 illustrates an example of a simplified equivalent electrical circuit for one of several selectable electrical configurations for the PV array example of FIG. 6. In the example of FIG. 7, all of the configurable PV panels in the PV array are interconnected in a parallel electrical circuit having a PV array output voltage of "E" volts, where "E" corresponds to the output voltage from a single configurable PV panel.

In an example of an alternative configuration illustrated in the simplified equivalent electrical circuit of FIG. 7, the twelve PV panels 100 of the PV array 10 of FIG. 6, represented in FIG. 7 by PV modules 108 are connected in a parallel electrical circuit. An output voltage from each PV module 108, measured across a positive terminal 110 and a negative terminal 112, is represented by a voltage "E". For the parallel electrical configuration of FIG. 7, corresponding to a "P" switching state selected for all twelve series-parallel selectors (X1-X12), the output voltage Vout of the PV array, measured across the first and second output terminals (168, 170) is equal to "E".

Figure 8:
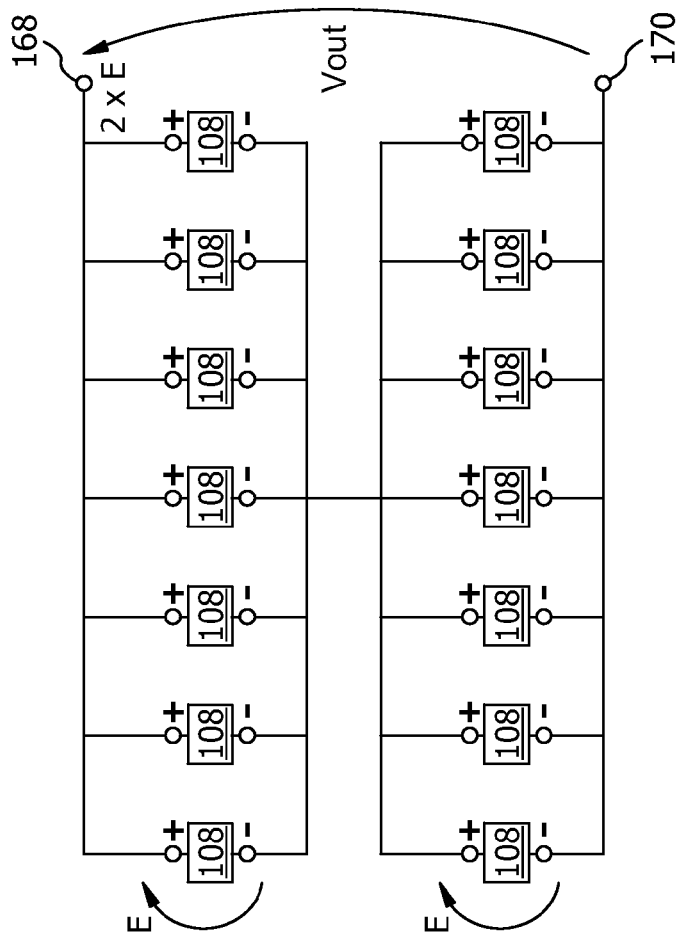
FIG. 8 shows an example of an equivalent electrical circuit for an alternative electrical configuration for the PV array of FIG. 6, comprising a combination of series and parallel electrical connections between configurable PV panels having a PV array output voltage of 2E volts.

Table 1 lists the switching states for the twelve series-parallel selectors in the examples of FIG. 6-12. FIGS. 8-12 illustrate more examples of alternative electrical configurations for the example embodiment of FIG. 6. FIG. 8 shows an equivalent electrical circuit for two series-connected groups with six configurable PV panels connected in parallel in each group. The PV array configuration of FIG. 8 has an output voltage across the first and second PV array output terminals (168, 170) of 2E, where "E" is defined as for FIG. 7.

Figure 9:
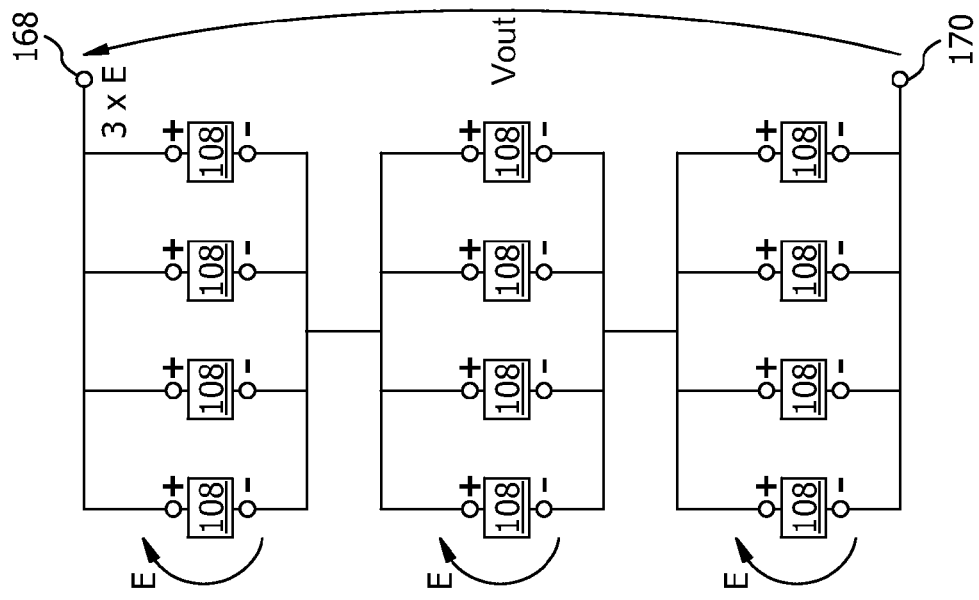
FIG. 9 shows an example of an equivalent electrical circuit for an alternative electrical configuration for the PV array of FIG. 6, comprising a combination of series and parallel electrical connections between configurable PV panels having a PV array output voltage of 3E volts.
Figure 10:
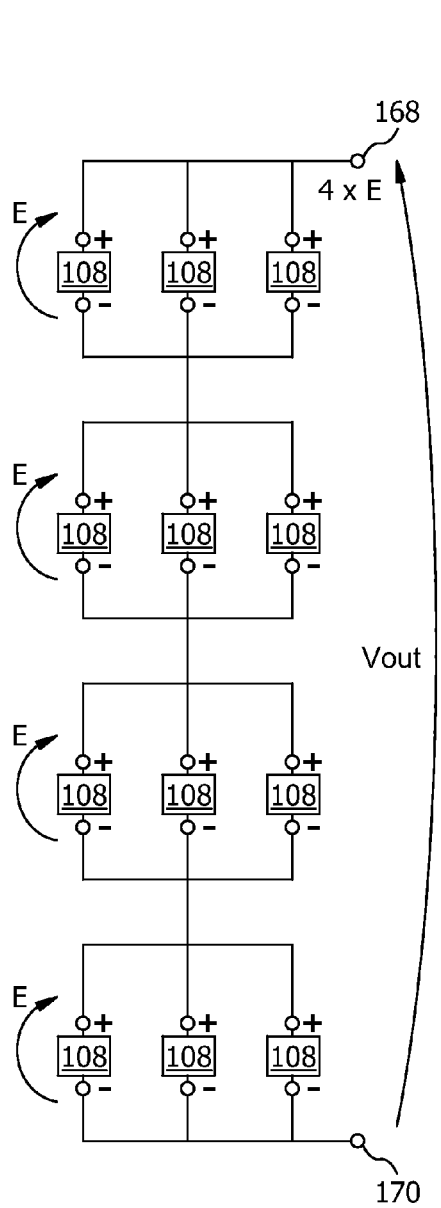
FIG. 10 shows an example of an equivalent electrical circuit for an alternative electrical configuration for the PV array of FIG. 6, comprising a combination of series and parallel electrical connections between configurable PV panels having a PV array output voltage of 4E volts.
Figure 11:
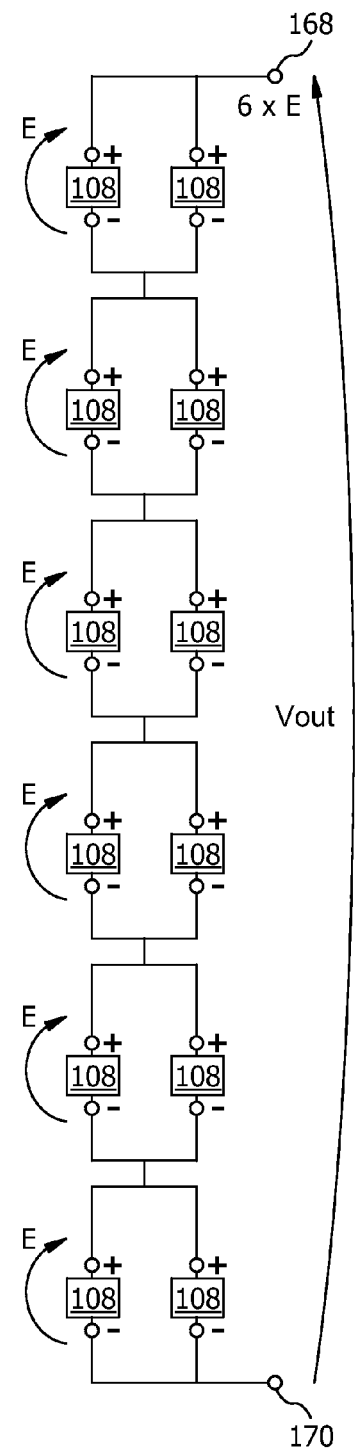
FIG. 11 shows an example of an equivalent electrical circuit for an alternative electrical configuration for the PV array of FIG. 6, comprising a combination of series and parallel electrical connections between configurable PV panels having a PV array output voltage of 6E volts.

FIG. 9 shows an example of an equivalent electrical circuit for three series-connected groups with four configurable PV panels connected in parallel per group and a PV array output voltage Vout equal to 3E. FIG. 10 shows an example of four series-connected groups having three configurable PV panels in parallel per group and a PV array output voltage of 4E. A PV array output voltage Vout equal to 6E is produced by the configuration illustrated in the example of FIG. 11, which shows six series-connected groups, each group having two configurable PV panels in parallel. Lastly, FIG. 12 shows an example of a configuration having the maximum value of PV array output voltage which can be achieved by changing serial and parallel connections between PV panels. In FIG. 12, all twelve configurable PV modules 108 are connected in a series electrical circuit.

TABLE 1

Examples of "S" and "P" switching states corresponding to PV array output voltage Vout for a PV array of 12 configurable PV panels, each panel producing output voltage "E".

| FIG. | X1 | X2 | X3 | X4 | X5 | X6 | X7 | X8 | X9 | X10 | X11 | X12 | Vout |
|---|---|---|---|---|---|---|---|---|---|---|---|---|---|
| 7 | P | P | P | P | P | P | P | P | P | P | P | P | E |
| 8 | P | P | P | P | P | S | P | P | P | P | P | S | 2E |
| 9 | P | P | P | S | P | P | P | S | P | P | P | S | 3E |
| 10 | P | P | S | P | P | S | P | P | S | P | P | S | 4E |
| 11 | P | S | P | S | P | S | P | S | P | S | P | S | 6E |
| 12 | S | S | S | S | S | S | S | S | S | S | S | S | 12E |

Other configurations not shown in the examples of FIGS. 6 to 12 may also be selected for the PV array example of FIG. 6. For example, a selected integer number "j" of PV panels may be electrically connected in series, with a remaining integer number "k" of PV panels from the PV array arranged in an integer number "x" groups of an integer number "y" of parallel-connected PV panels each. Alternatively, different groups of parallel-connected configurable PV panels may have different numbers of PV panels per group.

The examples of FIGS. 6 to 12 may be extended to very large PV arrays comprising many hundreds or even many thousands of panels. Configurable PV panels are well suited for use in very large PV arrays comprising a plurality of series-connected chains of PV panels, with the serial chains further connected to one another in a parallel electrical circuit. In some very large arrays, an inverter having a high value for minimum DC input voltage may be preferred. For example, in one example of a grid-connected inverter, the minimum DC input voltage for the inverter is approximately fifteen times the voltage output from a single PV panel. That is, at least fifteen PV panels may be electrically connected in series to generate an output voltage large enough to meet input requirements for the inverter. The PV array may have many series-connected chains of PV panels with the chains of panels further connected in parallel to one another and to the inputs of the inverter. Operation of configurable PV panels in a large configurable array may be compared to the operation in the examples described previously herein by extending the numbers of PV panels in each serial chain and by placing more than one chain of panels in parallel electrical connection. For example, each of the configurable PV panels in the examples of FIGS. 7-12, represented in the figures by a PV module 108, could be replaced by a series-connected chain of configurable PV panels to model the behavior of a very large number of PV panels in a PV array supplying power to an inverter with a high minimum input voltage.

Having reviewed the operation of a configurable PV panel in a configurable PV array, the following examples describe how insulation resistance can be measured for every individual PV panel in a PV array, or for every group of PV panels in a PV array, and how dielectric breakdown faults, if detected, may be located to a specific part of the PV array without disassembling and reassembling parts of the array. Referring again to the configurable PV array, IRT, controller, and switches in the example of FIG. 1 and the configurable PV panel in the example of FIG. 2, an example of a method for measuring the insulation resistance of a selected PV panel in a PV array may begin with disconnecting the inverter 172 from the array outputs (168, 170) by opening the positive and negative output switches (70, 71), then setting the bypass selector for other panels in the array to a "B" (Bypass) switching state, except for the PV panel whose insulation resistance is to be measured. The bypass selector for the PV panel to be measured is set to an "N" (Normal) switching state. For example, to measure insulation resistance for PV panel 100 number 1 in FIG. 1, bypass selectors for PV panels 100 numbers 2-$n$ are set to "B", thereby bypassing the PV modules in those panels and excluding the bypassed PV modules from the insulation resistance measurement. An example of an equivalent circuit for measurement of PV panel 100 number 1 with PV panels 2-$n$ bypassed is shown in FIG. 14.

As suggested by the example of FIG. 14, along with setting the bypass selectors to "B" for PV panels other than the PV panel to be measured, the outputs of the PV panel 100 number 1 are electrically connected to the PV array output terminals (168, 170). The outputs of PV modules in the rest of the PV array, i.e. the part of the PV array not being measured, are not electrically connected to the PV array output terminals. After setting the bypass selectors, the next step shorts the PV array positive output feeder 80 to the PV array negative output feeder 81. After the positive output feeder has been shorted to the negative output feeder, the IRT 60 makes an insulation resistance measurement of PV panel 100 number 1. Insulation resistance measurements may be completed successfully whether the serial-parallel selector on the tested PV panel or the serial-parallel selectors in other parts of the PV array are in the "S" or "P" states. For the configuration shown in the examples of FIGS. 1 and 14 after setting the bypass selectors as described above, the insulation resistance measured by the IRT 60 between line terminal 61 and earth terminal 62 may include contributions to leakage current measured for PV panel number 1 and contributions from the interconnecting cables between the PV panels and the bypass and serial-parallel selectors in the bypassed parts of the PV array. If the measured insulation resistance is within a preferred range, that is, no dielectric fault has occurred and insulation resistance is high enough to indicate that leakage currents though electrical insulation are too small to impair operation of the PV array, then the bypass selectors may be changed to isolate a different PV panel, for example the next sequential PV panel in the PV array.

After completing an insulation resistance measurement, the IRT 60 optionally sends measured values to the controller 63 for logging and analysis or transmission to an external computer system, and the test advances to the next PV panel in the PV array until every PV panel has been measured. When insulation resistance measurements have been completed, or when the time duration for conducting insulation resistance measurements has expired, the PV array may be returned to normal operation by opening the first and second shorting switches (54, 55) and closing the positive and negative output switches (70, 71) for connecting PV array output power to the inverter 172.

Insulation resistance may be measured for a group of PV panels. A PV array may be partitioned into a selected number of groups of panels. Preferably, every PV panel in a PV array is assigned to at least one selected group of PV panels. All groups may have a same number of PV panels, or groups may include different numbers of panels in each group. Groups of panels may be selected by geographic location in a large array, by panel manufacturer in an array comprising panels from different manufacturers, by panel age, or by other criteria selected by an array operator. Before insulation resistance measurements begin, the inverter 172 may be decoupled from the array by opening the output switches (70, 72) and the positive output branch line 50 and negative output branch line 51 are connected together, for example by the controller 63 as previously explained. Then a group of PV panels may be selected for measurement and the bypass selectors for all the PV panels in the selected group set to "N" while bypass selectors for the rest of the PV array are set to "B". Insulation resistance is measured by the IRT 60 as previously described for one configurable PV panel. The resulting value of insulation resistance applies to the PV panels and interconnecting cables in the selected group. To test another group of PV panels, the bypass selectors in the previously tested group are set to "B", the bypass selectors in the newly selected group are set to "N", and a new value of insulation resistance is measured. Groups may be tested one after another in this manner until the entire PV array has been evaluated. If a measured value of insulation resistance for a group indicates an undesirable insulation resistance condition such as a low value of resistance, a high leakage current, or a value of resistance corresponding to dielectric breakdown, then individual PV panels within the group may be measured as earlier described until a problem is found with one or more of the panels. Historical trends and rates of change of insulation resistance may be calculated for groups of PV panels as for individual PV panels.

Insulation resistance problems may occur not only in PV panels but also cable assemblies or feeders in a PV array. It may therefore be desirable to check the insulation resistance of cable assemblies and feeders before making measurements on PV panels. To check the cable assemblies 166 and feeders 80 and 81 of the PV array 10 example of FIG. 1, all PV panels are interconnected in series by setting series-parallel selectors on each panel to "S" and then setting all bypass selectors to switching state "B". Refer to FIG. 2 and related description above for operation of the series parallel selector 138 and bypass selector 120. The PV array may be disconnected from the inverter 172 by opening output switches 70, 71) and the positive and negative feeders may be shorted together by closing the first and second shorting switches (54, 55). After placing all PV panels in the PV array in series electrical connection, isolating the array from the inverter, and switching all bypass selectors to "B", an insulation resistance measurement of all the series-connected PV panels in the PV array may be made with the IRT 60.

Figure 15:
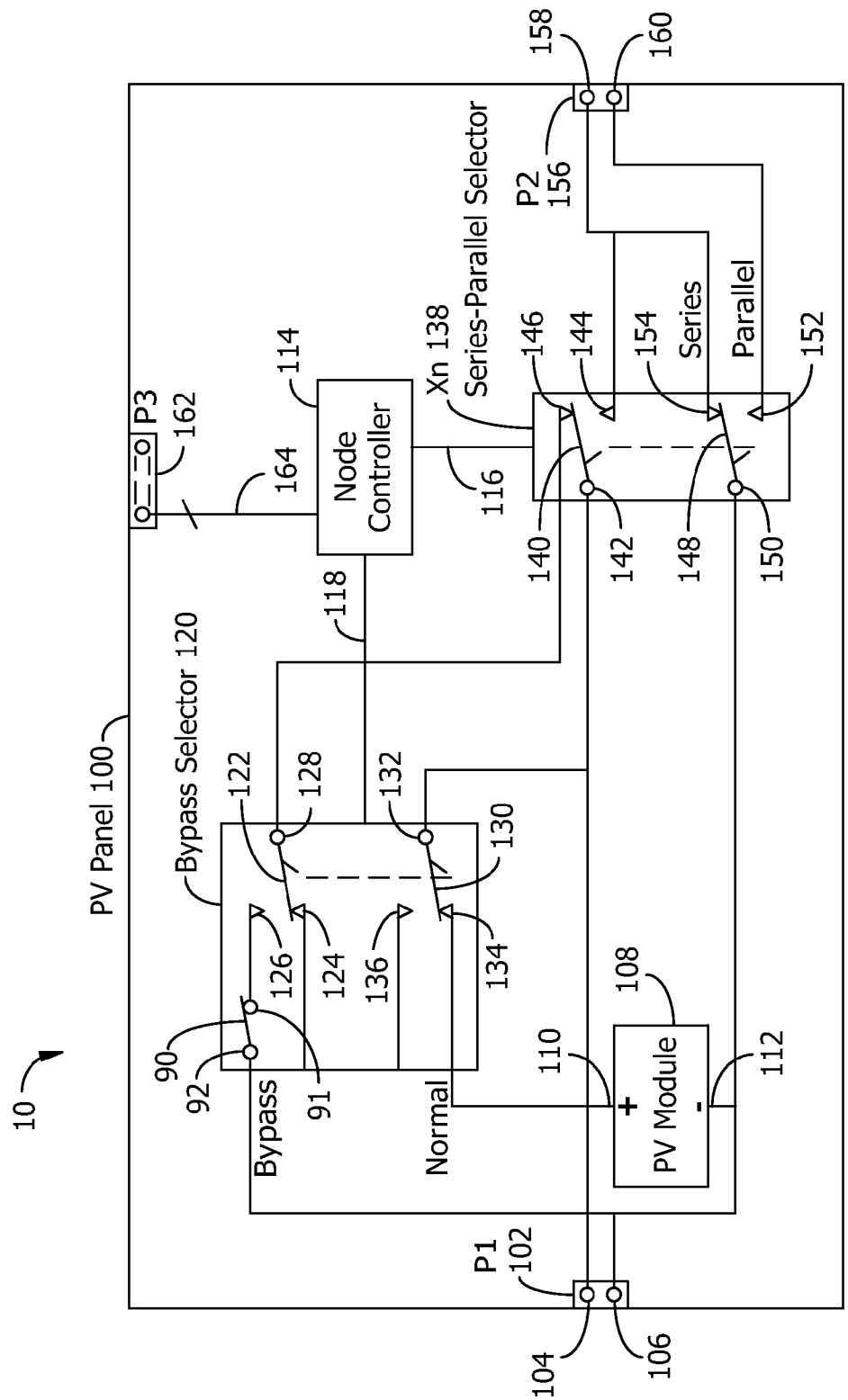
FIG. 15 is a schematic diagram of another example of a configurable PV panel for a configurable PV array in which a circuit breaking switch is placed in series electrical connection with a bypass selector switch.

A modification of a bypass selector enables identification of a particular PV panel or cable assembly as the source of a problem detected during insulation resistance measurements of cable assemblies and feeders with all PV panels serially connected as described above. A bypass selector 120 may optionally include a circuit breaking switch 90 as shown in FIG. 15. Alternately, the circuit breaking switch 90 may be electrically connected as shown in the example of FIG. 15 but may be a separate part from the bypass selector 120. The circuit breaking switch 90 may be opened and closed by the node controller 114. An insulation resistance measurement may first be made with all bypass selectors set to "B", all PV panels in the PV array in series electrical connection, and the circuit breaking switch in all PV panels numbers 1 to n in a closed position. FIG. 15 shows an example of a circuit breaking switch 90 in a closed position between switch terminals 91 and 92. If no insulation resistance problem is detected in the serially-connected chain of PV panels bypassed as described above, it may be concluded that there is no insulation resistance problem with the cable assemblies. However, If an insulation resistance problem is detected, for example a value of insulation resistance that is lower than desired or a value representative of a dielectric breakdown having already occurred, then the location of the problem can be determined by sequentially opening up circuit breaking switches 90 on each PV panel in reverse order, starting with PV panel 100 number n, then panel number n−1, n−2, and so on, making a new insulation resistance measurement after opening each circuit breaking switch 90 until the measured value indicates no problem with insulation resistance.

Opening the circuit breaking switch 90 on PV panel 100 number n electrically isolates PV panel number n and the feeder 81 from the remaining PV panels 100 in the PV array. Performing an insulation resistance measurement with the circuit breaking switch on PV panel number n open causes PV panel number n and feeder 81 to be excluded from the insulation resistance measurement of the rest of the serially-connected PV panels and cables. If after opening the circuit breaking switch 90 on PV panel 100 number n, no insulation resistance problem is detected, the insulation resistance problem may be located in either PV panel number n or in the feeder 81. If after opening the circuit breaking switch 90 on PV panel 100 number n, an insulation resistance problem is still detected, the insulation resistance problem may be located in a lower-numbered PV panel or its associated cable assembly 166 to the next-higher-numbered PV panel. By stepping though insulation resistance tests in the serially-connected chain of PV panels and opening circuit breaker switches on each panel, one at a time, an insulation resistance problem can be localized to the combination of the PV panel number whose circuit breaking switch was open when no insulation problem was first detected, and the cable assembly connecting that PV panel to the next-higher-numbered PV panel.

The disclosed embodiments of the invention may be applied to optimization of output power from a PV array by detecting a PV panel or cable assembly with an insulation resistance value corresponding to an unacceptably high value of leakage current. A leakage current from one PV panel in a PV array may reduce power output from the entire array as previously discussed. A method for optimizing PV array output power in accord with an embodiment of the invention comprises the steps of measuring an insulation resistance value for each PV panel in a PV array, comparing the measured values of insulation resistance to a threshold value corresponding to an unacceptably high value of leakage current through electrical insulation in the PV array and further corresponding to a threshold of unacceptably low power output from the PV array, and isolating the PV panel with a value of insulation resistance less than the threshold value by setting its bypass selector to B. Measurement of insulation resistance values for configurable PV panels may be continued until every PV panel in the PV array has been tested and every PV panel with insulation resistance less than the threshold value has been bypassed from the array. Similarly, power output from the PV array may be maximized by minimizing a number of PV panels having voltage and current coupled to the PV array outputs and a value of insulation resistance less than a threshold value.

Unless expressly stated otherwise herein, ordinary terms have their corresponding ordinary meanings within the respective contexts of their presentations, and ordinary terms of art have their corresponding regular meanings.

What is claimed is:

1. A method for measuring insulation resistance in a photovoltaic (PV) array comprising:
   selecting a group of PV panels in the PV array for a measurement of insulation resistance;
   setting a bypass selector for each PV panel in the selected group to a non-bypassed switch state;
   setting a bypass selector for each PV panel not included in the selected group to a bypassed switch state;
   measuring a value of insulation resistance for the selected group of PV panels;
   saving previously measured values of insulation resistance for a selected PV array component in a historical record;
   calculating a rate of change in the insulation resistance value for the selected PV array component by comparing measurements from historical records with current measurements;
   projecting a time duration for the insulation resistance value to fall below a specified threshold value of insulation resistance, at the calculated rate of change; and
   performing preventive maintenance on the selected PV array component before the expiration of the projected time duration.

2. The method of claim 1, further comprising:
   opening a negative output switch and a positive output switch for the PV array to disconnect a PV array output voltage from an inverter;
   closing a first shorting switch and a second shorting switch to short a PV array positive output feeder to a PV array negative output feeder; and
   measuring a value of insulation resistance between the shorted positive and negative output feeders and a ground reference terminal.

3. The method of claim 1, further comprising:
after measuring a value of insulation resistance for the selected group of PV panels, closing a negative output switch and a positive output switch for the PV array to reconnect the PV array output voltage to the inverter; and
after measuring a value of insulation resistance for the selected group of PV panels, opening a first shorting switch and a second shorting switch to disconnect a line terminal input for an insulation resistance tester from the a PV array positive output feeder and the PV array negative output feeder.

4. The method of claim 1, further comprising:
repeating the steps of:
  selecting a group of PV panels in the PV array for a measurement of insulation resistance;
  setting a bypass selector for each PV panel in the selected group to a nonbypassed switch state;
  setting a bypass selector for each PV panel not included in the selected group to a bypassed switch state; and
  measuring a value of insulation resistance for the selected group of PV panels, until a measurement of insulation resistance has been made for every group of PV panels for the PV array.

5. The method of claim 1, further comprising assigning every PV panel in a PV array to at least one group of PV panels for measurement of insulation resistance.

6. The method of claim 1, further comprising partitioning the PV array into more than one group of PV panels for measurement of insulation resistance.

7. The method claim 1, further comprising measuring the insulation resistance for each and every PV panel in a group of PV panels only when an insulation resistance problem has been detected for the group of panels.

8. The method of claim 1, further comprising making a separate insulation resistance measurement for each PV panel in a PV array without disconnecting any cable assemblies between PV panels.

9. A method for measuring insulation resistance in a photovoltaic (PV) array of claim 1, comprising:
selecting a group of PV panels in the PV array for a measurement of insulation resistance;
setting a bypass selector for each PV panel in the selected group to a non-bypassed switch state;
setting a bypass selector for each PV panel not included in the selected group to a bypassed switch state; and
measuring a value of insulation resistance for the selected group of PV panels,
wherein, before making an insulation resistance measurement for any group of PV panels, a first insulation resistance measurement is made by setting the bypass selector in every PV panel to a "bypass" switching state, setting a serial-parallel selector in every PV panel to a "serial" switching state, and making an insulation resistance measurement corresponding to an insulation resistance of cable assemblies and feeders in the PV array.

10. The method of claim 1, further comprising:
measuring an insulation resistance value for each PV panel in the PV array;
comparing the measured value of insulation resistance for each PV panel to a threshold value corresponding to a selected value of leakage current; and
when the measured value of insulation resistance is less than the threshold value, setting a bypass selector on the PV panel having the measured value of insulation resistance less than the threshold value to a bypass switching state.

11. A method for measuring insulation resistance values for cable assemblies and feeders in a PV array, comprising:
setting a series-parallel selector on each PV panel in the PV array to connect all the PV panels to one another with serial electrical connections;
setting a bypass selector on each PV panel in the PV array to a "bypass" switching state, thereby excluding output voltage from a PV module on each PV panel from PV array output voltage;
measuring a value of insulation resistance for the PV array;
opening a negative output switch and a positive output switch for the PV array to disconnect a PV array output voltage from an inverter;
closing a first shorting switch and a second shorting switch to short a PV array positive output feeder to a PV array negative output feeder;
measuring a value of insulation resistance between the shorted positive and negative output feeders and a ground reference terminal;
comparing the measured value of insulation resistance to a threshold value corresponding to an insulation resistance fault; and
when the measured value of insulation resistance is less than the threshold value, identifying a PV panel as the source of the insulation resistance problem by sequentially opening a circuit breaking switch connected to the bypass selector on each PV panel and making another insulation resistance measurement after each opening of a circuit breaking switch, one PV panel after another.

12. The method of claim 11, further comprising:
making a new insulation resistance measurement after each opening of a circuit breaking switch, until a measured insulation resistance value indicates no problem with insulation.

13. The method of claim 11, further comprising:
identifying the last PV panel for which a circuit breaking switch was opened and no insulation problem was detected as the source of the insulation resistance problem.

14. The method of claim 12, further comprising measuring insulation resistance for every PV panel in the PV array.

15. The method of claim 12, further comprising:
for every PV panel having a value of insulation resistance less than the threshold value, setting a bypass selector to a bypass switching state.

16. The method of claim 12, further comprising minimizing a number of PV panels having voltage and current coupled to the PV array outputs and a value of insulation resistance less than the threshold value, thereby maximizing an amount of power produced by the PV array.

* * * * *